Dec. 8, 1970 H. LOCHSTAMPFER 3,546,614

TRANSISTOR AMPLIFIER CIRCUITS WITH CONSTANT CURRENT SOURCE SUPERIMPOSED THEREON

Filed Feb. 26, 1968 2 Sheets-Sheet 1

INVENTOR:
Horst Lochstampfer
BY Spencer & Kaye
Attorneys

TRANSISTOR AMPLIFIER CIRCUITS WITH CONSTANT CURRENT SOURCE SUPERIMPOSED THEREON
Filed Feb. 26, 1968

INVENTOR:
Horst Lochstampfer
BY Spencer & Kaye
Attorneys

United States Patent Office 3,546,614

Patented Dec. 8, 1970

3,546,614
TRANSISTOR AMPLIFIER CIRCUITS WITH CONSTANT CURRENT SOURCE SUPERIMPOSED THEREON

Horst Lochstampfer, Mannheim-Lindenhof, Germany, assignor of one-half to REGA Regelungs- und Steuerungstechnik GmbH & Co. KG, Siegburg-Kaldauen, Germany Filed Feb. 26, 1968, Ser. No. 708,179
Claims priority, application Germany, Feb. 28, 1967, 1,512,721
Int. Cl. H03f 3/04
U.S. Cl. 330—22 8 Claims

ABSTRACT OF THE DISCLOSURE

The current from a constant current source of high internal resistance is superimposed upon a transistor in the same direction as the operating direct current effected by the input signal. This relationship is used in a transistor amplifier circuit to control certain internal resistance characteristics of a transistor so that the amplifier characteristics may be made largely independent of the transistor, and to increase gain.

This invention relates to an amplifier circuit used to modify electrical signals.

It is the purpose of amplifier circuits of this kind to modify an electrical signal, e.g. a voltage or a current, with respect to frequency, time or amplitude, e.g. to modulate, sense or amplify it to a higher value.

It is known that the signal to be modified can be passed to an amplifier for this purpose. The amplifier may, for example, be an electron tube, a NPN or PNP transistor or a field effect transistor. Amplifiers are equipped with at least one control electrode referred to as grid in the case of the electron tube, as base in case of the transistor and as gate or grid in the case of the field effect transistor and with two main electrodes through which the main current is flowing. The signal input is formed by the control electrode together with one main current electrode as the reference electrode, said reference electrode being referred to as cathode in case of the electron tube, as emitter in case of the transistor, as source in case of the field effect transistor and as "H*st*" in the present specification. The other main current electrode which has generally an amplified output voltage and which is referred to as anode in case of the electron tube, as collector in case of the transistor and as drain in case of the field effect transistor is referred to herein collectively as "H*a*."

In general, three basic circuits are known: (1) the H*st* grounded-base circuit, (2) the H*a* grounded-base circuit, and (3) the control electrode grounded-base circuit. The first one serves the amplification of voltage and current, the second one the amplification of current or resistance, and the last one the amplication of voltage. As is known, each of the three circuits has its particular input and output plate impedance or resistance. However, all of the circuits are more or less largely dependent upon the characteristics of the amplifier. Reciprocal of amplification factor, slope, internal effective resistance and reactance, current amplification factor and all of the four-terminal parameters vary as the modulation, the operating point, the temperature, the operating D.C. voltage, the time and the spread between units vary. The influences can be largely reduced by using the well-known negative feedback, but this reduces also the intended effect, e.g., amplification, and increases the expense. When connecting a plurality of expensive steps in series, the overall circuit is readily inclined to auto-excitated oscillations.

It is an object of the present invention to largely modify the amplifier characteristics, to reduce to any degree desired the dependence of amplifier characteristics on modulation, operating point, temperature and spread and to increase the stage gain.

These objects are achieved in accordance with the invention by superposing on one amplifier or a plurality of amplifiers an additional current flowing in the same direction as the closed circuit D.C. current derived from a current source having an internal resistance dimensioned correspondingly high as compared with the operating or load resistance connected in parallel, and controlling accordingly the control electrode and, if desired, additional electrodes.

This additional current may be superposed at the main current electrode, the reference electrode, the H*a* as well as at both main electrodes. For example, if a load resistance is connected with the reference electrode, i.e. if a current which is amplified against the control electrode is desired to flow in the load resistance, the additional current which is a direct current in this case is superposed on the main current electrode H*st* without markedly loading the load resistance, i.e. with a high impedance internal resistance, i.e. the additional current is fed or led off depending upon the amplifier type. The input signal voltage drives a certain workable control range of the main current electrode H*st*. The operating main current varies from a minimum value to a maximum value. If the additional direct current is high as compared with the maximum operating main current, the change of the characteristic values of the amplifier becomes correspondingly small. The slope of the amplifier increases as the main current increases, and since the reciprocal value of slope equals the internal resistance with satisfactory approximation, this internal resistance decreases as desired. It can be largely varied by means of the additional current. In general, the additional current need not be very high as compared with the maximum operating main current, it being sufficient for the additional current to have a level which does not allow the slope and other characteristics to drop below a permissible value if the operating main current is at its minimum.

For example, if a load resistance is connected in the main current electrode H*a*, i.e. if an operating voltage amplified as compared with that of the control electrode is to be recovered, then the additional current which is a direct current in this case is superposed on the main current electrode H*a* highly resistively, i.e. without markedly damping the H*a* operating resistance. Here again, the flow of the additional direct current through the amplifier may effect optimum amplifier characteristics. Since voltage amplification, with a satisfactory approximation, equals the ratio of H*a* overall resistance to the internal resistance at the H*st* provided no additional resistance is connected to the main current electrode H*st*, and the H*st* internal resistance decreases to an optimum as the current increases, voltage amplification will increase. Variation of the operating current has a given relationship to the additional current. Corresponding to this relation or ratio, the amplified operating voltage at the H*a* main current electrode is linearized.

In general, in the amplifiers, the additional current increases the internal conductance at the H*a* main current electrode or decreases its plate resistance. This sets an upper limit to the size of the load resistance in the main current electrode H*a* and consequently to voltage amplification which is proportional to this resistance. Therefore, when connecting to the main current electrode H*a* of the first amplifier described above the main current electrode H*st* of a second amplifier, connecting to the main current electrode H*a* of the second amplifier the load resistance and feeding the additional current at the juncture of the first Ha main current electrode and the second Hst main current electrode, then the plate resistance of the first main current electrode Hst decreases as desired and the plate resistance of the second main current electrode Ha remains highly resistive. The control electrode of the second amplifier must be connected to a D.C. potential which, while taking into account the voltage gradient between its control electrode and main current electrode Hst, permits an adequate operating voltage to the main current electrode Ha of the first amplifier. This operating voltage is low because the connected second main current electrode Hst is low valued. For alternating current, the second amplifier Ve is operated in Ste grounded-base connection. If the additional current is very high as compared with the quiescent direct current of the second amplifier, the first Ha internal resistance may become excessively low and the second Hst internal resistance excessively high. It is then convenient to connect to the second main current electrode Ha the main current electrode Hst of a third amplifier Ve using Ste grounded-base connection and to connect to the Ha of the latter the load resistance. Part of the additional current is then passed to the juncture of the second Ha with the third Hst, thereby reducing the resistance of the second Hst. To take into account the necessary operating voltage of the connected second main current electrode Ha, the control electrode of the third amplifier must again be connected to a correspondingly high potential. Depending upon the requirements, it is now possible to connect to the third main current electrode Ha a fourth amplifier Ve in place of the load resistance and to connect to the main current electrode Ha of said fourth amplifier, if desired, a fifth amplifier Ve etc., using grounded-base connection in each case. The load resistance is connected to the main current electrode Ha of the last amplifier Ve. Part of the additional current is superimposed at each Hst–Ha juncture. The sum of the partial currents flows through the first amplifier.

When superposing on the main electrode Hst of the first amplifier approximately the same current from a D.C. voltage source having approximately the same characteristic as the partial sources at the junctures, the deviations from the additional current do not flow through the load resistance as has been described above for one of the amplifiers.

Furthermore, the additional current may be fed or led off in parallel with the load resistance through an inductive reactance and an active resistance. At the lowest frequency, it must be high as compared with the load resistance. The ohmic component determines the additional current.

A highly resistive simple power source is available at the main current electrode Ha of an additional amplifier because the Ha internal resistance is generally highly resistive. Therefore, if the main current electrode Hst of this current-generating amplifying member is connected to the same terminal of the operating power source as the load resistance and if a fixed current or voltage is applied to the control electrode, a corresponding current will flow at the main current electrode Ha. The main current electrode Ha generating the additional current is connected to the main current electrode of the amplifying member. The voltage at this point varies in accordance with the pattern of the input signal. Then the main current electrode Ha of the amplifying member generating the additional current is also shifted and nevertheless furnishes the constant additional current if the internal resistance of this main current electrode Ha is high as compared with the load resistance.

By appropriate dimensioning at the main current electrodes Hst and Ha, the voltage amplification becomes independent of the characteristics of the amplifying member.

An additional current is superposed at the juncture of the external resistance and the main current electrode Ha where an amplified operating voltage is to be recovered. At this point, a specific quiescent D.C. voltage must be maintained about which the operating voltage flucuates. This quiescent D.C. voltage must remain as constant as is possible. As has been described above, certain deviations therefrom may readily occur in case of a high additional current and flow through the load resistance. They are then capable under circumstances to effect a large shift of the quiescent D.C. voltage. Therefore, it is desirable to adjust automatically the quiescent D.C. voltage by negative feedback from the main current electrode Ha to the control electrode Ste of the amplifying member Ve which, in case of series connection of amplifying members, is that which is not operated in grounded-base arrangement of the control electrode. Similarly, the operating point may be adjusted by feedback from the main current electrode Ha to the input of the amplifying member Ve producing the additional current or to the current of the other current sources.

Furthermore, it is possible for stabilization of the operating point to tap the quiescent D.C. voltage of the main current electrode Ha with a reference D.C. voltage which, for example, is obtained from a voltage divider of the operating D.C. voltage through the Ste–Hst section of an amplifying member Ve and to return the current of the main current electrode Ha of the comparing amplifying member Ve for control. Here again, the effect of variations of the voltage of the main current electrode Ha or of the load resistance on the comparing amplifying member Ve is such that its Ha current counteracts this variation in the amplifying or current-generating member Ve or in other current sources. If necessary or desired, amplifying members Ve as resistance amplifers are connected in series, i.e. at the input and/or output side, with the comparing amplifying member.

The feedback loop must transmit the zero frequency, i.e. the D.C. voltage to be fed back or the direct current and block the working frequency range or a plurality of ranges in order that the amplified operating voltage does not counteract the input voltage as negative feedback, i.e. damping, unless such dampings are desirable for a specific range or a plurality of ranges. The operating frequency range may be narrow-banded or broad-banded. It is also possible that a plurality of frequency ranges are damped to a greater or lesser extent and/or transmitted. Thus, it is desirable to insert into the feedback loop one or more frequency-dependent members transmitting and/or blocking certain frequencies or frequency ranges, if desired through one or more amplifying members Ve serving as resistance amplifiers and connected in series before and/or after the input side and output side, respectively.

However, it may also be preferable to feed an input signal in the feedback loop, if necessary through one or more amplifying members Ve serving as resistance amplifiers. In particular, if a direct voltage of a certain adequate amount is superposed on the input signal, it is preferable to feed in the feedback loop because the isolating capacitor may then be saved. The direct voltage superposed on the input signal simultaneously replaces the reference direct voltage which is compared with the voltage of the main current electrode Ha via the Ste–Hst section of the comparing amplifying member Ve.

It is also possible to feed an input signal at a main current electrode Hst on which a current is superimposed. Particularly suitable is the main current electrode Hst of the second amplifying member Ve, said Hst being connected to the main current electrode Ha of the first amplifier member Ve. This point is to be adjusted at a low resistance by additional currents and, therefore, it may be preferable to feed just at this point.

The additional current should also be controlled by an input signal. The current variations flow through the load resistance from which they are to be derived after amplification.

As has been described above, the internal resistance of the main current electrode H*st* varies as the addiitonal current varies. The internal resistance of the main current electrode H*st* is inversely proportional to the additional current. Since this internal resistance is also inversely proportional to the voltage amplification factor, i.e. the ratio of operating output voltage at the main current electrode H*a* to the input voltage at the control electrode, the voltage amplification factor becomes proportional to the additional current. Thus, it is possible by means of the additional current to control or regulate the amplification factor of the amplifier circuit.

In a further embodiment of the invention, the amplifier circuit may also be used as a limiting amplifier. Particularly suitable for this purpose is the arrangement where the input signal is superimposed at the feedback loop, at the reference voltage, e.g. the voltage divider.

Embodiments of the invention are described hereafter by way of example with reference to the drawings wherein FIG. 1 is a circuit diagram for a transistor and shows the reference numerals used in this specification.

Figure 1:
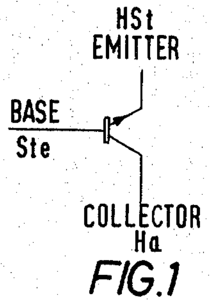

FIG. 1 shows a npn-transistor as amplifier member V*e* with the corresponding electrode designations, S*te* being the control electrode, i.e. the base; H*st* being the main current electrode, i.e. the emitter where the amplifier member can be controlled together with the control electrode, and H*a* being the collector, i.e. the main current electrode from which an amplified operating voltage can be derived at a load resistance. The examples refer to a transistor type having an allowable collector current of about 50 ma. Current amplification $h_{21}$ should be about 100.

Figure 2:
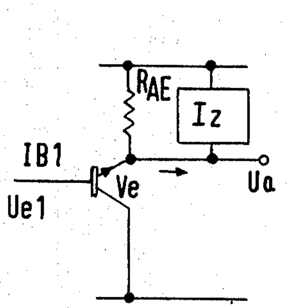
FIG. 2 shows a transistor amplifier according to the present invention in collector connection.
Figure 3:
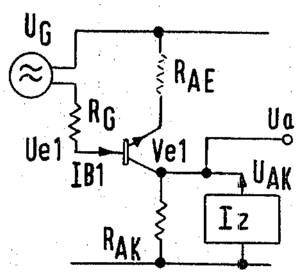
FIG. 3 shows an amplifier in which the additional current is fed in at the collector.

In FIG. 2, the additional direct current $I_z$ is superposed on the main current electrode H*st*, i.e. on the emitter. In FIG. 3, it is superposed on the main current electrode H*a*, i.e. the collector. The base current $I_{B1}$ of the transistor is sufficiently high that the quiescent direct current and the additional direct current are transmitted through the main current electrodes according to the characteristic curve point selected. The input signal voltage is designated as U*e*1.

With a satisfactory approximation, the differential internal resistance of the emitter is

$$h_{11b}=\frac{kT}{qIe} \quad (1)$$

$$h_{11b}=\frac{25mv}{Ie}\ (\text{at } 300°\text{K., } 20°\text{ C.}) \quad (2)$$

As the current increases, $h_{11b}$ decreases. Thus, the transistor controls the load resistance $R_{AE}$ in FIG. 2 at the low internal resistance desired which now undergoes only a minor change with the operating current which is low as compared with the additional current.

Voltage amplification in FIG. 3 is $$Vu=\frac{U_{AK}}{Ue1} \quad (3)$$

or $$Vu=\frac{R_{AK}||Ri_K}{h_{11b}+R_{AE}} \quad (4)$$

where $R_{AK}$ is the load resistance at the collector. With Equation (2) and $R_{AE}=0$, V*u* then becomes $$Vu=\frac{R_{AK}||Ri_K Ie}{25mv.} \quad (5)$$

Connected in parallel with $R_{AK}$ is the differential collector internal resistance which, with $R_{AE}=0$ and with $R_G \gg h_{11}$, is $$Ri_K=\frac{1}{h_{22}} \quad (6)$$

It decreases as the collector current increases and, therefore, sets a limit to the amount of $R_{AK}$. With a collector current of 1 ma, $$\frac{1}{h_{22}}$$

is about 100 kilo ohms. With Equation (5) (at $R_{AK}=Ri_K$), $$Vu=\frac{100{,}000}{2\cdot 25}=2{,}000$$

$Ri_K$ increases if the emitter resistance $R_{AE}$ is high as compared with $R_G+h_{11}$. If $R_G+h_{11}$ can be neglected against $R_{AE}$, $$Ri_K=\frac{h_{21}}{h_{22}} \quad (7)$$

where $h_{21}$ is the current amplification. Thus, as compared with Equation 6, $Ri_K$ is higher by about 2 powers of ten because $h_{21}$ is generally about 100.

Figure 4:
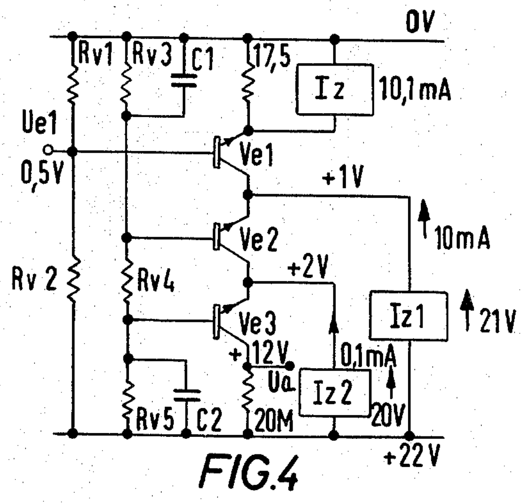
FIG. 4 shows a cascade amplifier according to the present invention.

Another working example which utilizes the increase in collector internal resistance is represented by FIG. 4. A first transistor V*e*1 is followed by a further transistor V*e*2 connected in series in grounded-base connection, and the latter is followed by a third series-connected transistor V*e*3 also in grounded-base arrangement. The base of V*e*1 is biased at 0.5 v. by means of R*v*1, R*v*2. This corresponds to the base-emitter voltage. The emitter is connected to a resistance of 17.5 ohms. For direct current stabilization, a resistance bridged with a capacitor may be series-connected with this resistance, which would require an increase in the base direct voltage. A voltage of 1 v. is applied to the collector of V*e*1 and 2 v. is applied to that of V*e*2. A collector-emitter voltage of 1 v. each is sufficient as workable control range. These voltages establish the resistances R*v*3, R*v*4, and R*v*5 which may, if necessary or desired, be connected in parallel with a capacitor (C1 and C2). An additional current of $Iz2=0.1$ ma. is flowing into the collector of V*e*2 and one of $Iz1=10$ ma. is flowing into that of V*e*1. The sum of the additional currents of 10.1 ma. may again be withdrawn at the emitter of V*e*1. If the additional current sources have identical physical properties, no differential currents occur which would otherwise flow through the load resistance of 20 mohms. The collector-emitter voltage of V*e*3 is 10 v., i.e. a voltage of 12 v. is applied to the collector and a quiescent voltage of 10 v. is obtainable at the load resistance of 20 mohms. Thus, the operating quiescent current is 0.5 $\mu$a. and the operating direct voltage 22 v. The internal resistances at the emitters, bases and collectors have approximately the following values with the currents shown in FIG. 4:

$h_{11b1}$—2.5 ohms (corresponding to Equation 2)
$h_{11_1}$—250 ohms ($h_{21}\cdot h_{11b1}$)
$Ri_{k1}$—70 kilo ohms
$h_{11b2}$—250 ohms (Equation 2)
$h_{11_2}$—25 kilo ohms ($h_{21}\cdot h_{11b2}$)
$Ri_{k2}$—70 mohms
$h_{11b3}$—50 kilo ohms (Equation 2)
$h_{11_2}$—25 kilo ohms ($h_{21}\cdot h_{11b2}$)
$Ri_{k3}$—500 mohms As required, the collectors of Ve1 and Ve2 are highly resistive signal sources for the associated emitters.

The voltage amplification is calculated as follows from Equation 4 when neglecting $Ri_{k3}$=500 mohms against $R_{AK}$=20 mohms:

$$Vu=\frac{20\cdot 10^6}{2.5+17.5}$$

$$Vu=10^6$$

The voltage amplification is substantially independent of the transistors themselves. It is dependent substantially only of the resistances $R_{AE}$=17.5 ohms and $R_{AK}$=20 mohms. The collector internal resistance $Ri_{K3}$=500 mohms and consequently its temperature and modulation dependence may be neglected. According to Equation 1, with a 10% change in temperature from 300° K. to 330° K., i.e. by 30° K., the resistance $h_{11b1}$=2.5 ohms is changed only by 0.1·2.5 ohms=0.25 ohms. Consequently, amplification is changed only by $$\frac{0.25}{2.5+17.5}=1.25\%$$

The transistors operated in grounded-base arrangement, Ve2 and Ve3, then pass on to the collector the current offered at the emitter with a low base control current loss. Thus, no disturbing effects are to be expected therefrom. The current variation of ±0.5 μa. produced by the input signal is negligible as compared with the high additional current of 10 ma. Thus, modulation dependence is absent.

If the independence of amplification of the transistors would be abandoned, i.e. $R_{AE}$ would be taken as 0 and $R_{AK}$ approximately as 500 mohms although some corrections would then still have to be made, the amplification factor, according to Equation 4, would be in the following order of magnitude:

$$Vu=\frac{500\cdot 10^6}{2\cdot 2.5}v$$

$$Vu=10^8 v.$$

Of course, due to the capacities connected in parallel, the high $R_{AK}$ resistance of 20 mohms does not allow high limiting frequencies. The limiting frequency is about 1 kc. To obtain the order of magnitude of video frequencies, i.e. at 5,000 times the frequency of 5 mc., the resistance $R_{AK}$ would have to be lowered to 1/5000, i.e. $R_{AK}$=4 kohms. Vu would still be only 200 and the expense of two Ste base steps unnecessary. However, if permitted by the transistor Ve1, the additional current could be increased to thereby further reduce $h_{11b1}$.

Figure 5:
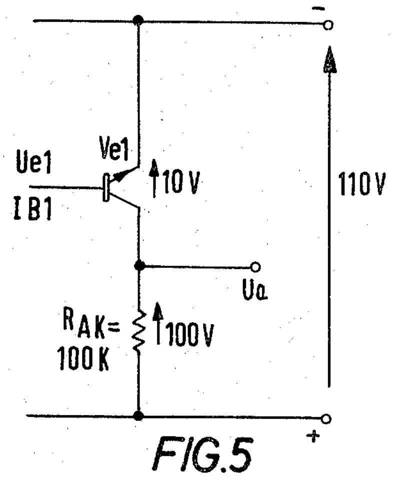
FIG. 5 shows an amplifier in which the additional current is derived from an increased operating D.C. voltage.

FIG. 5 shows an example how the additional current may be recovered from an operating direct voltage which is increased substantially beyond the quiescent direct voltage. As is shown in the drawing, the quiescent direct voltage of the Ve is 10 v. The operating or load resistance in the collector $R_{AK}$ is 100 kilohms. The current $L_{B1}$ at the base is adjusted sufficiently high that a current of 1 ma. may flow through the transistor. Then 100 v. are obtained at the $R_{AK}$. Thus, the operating direct voltage must be 110 v. The signal voltage Ue1 at the base causes a change in voltage of ±10 v. at the collector. Thus, the maximum collector-emitter voltage may be only 20 v. and cannot be detrimental to the transistor.

Figure 6:
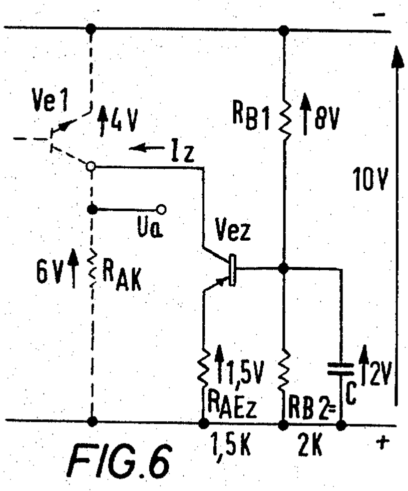
FIG. 6 shows the construction of an amplifier with a constant current source.

FIG. 6 shows a further example how to generate the additional current. The additional transistor Vez which is a pnp transistor is biassed at the base at 2 v. direct voltage by means of the resistances $R_{B1}$ and $R_{B2}$. To the base is still connected the capacitor C which, if the resistance of $R_{B1}$ and $R_{B2}$ is not sufficiently low, short-circuits the base for alternating current. Connected to the emitter is the stabilizing resistance $R_{AEz}$. In case of silicon transistors, the voltage drop between the base and emitter is about 0.5 v. At the emitter resistance $R_{AEz}$=1.5 kilohms, the voltage is then 1.5 v. Then a direct current of 1.5 v./1.5 kilohms=1 ma. flows through the emitter and, with a very satisfactory approximation, also through the collector. The order of magnitude of the collector internal resistance $Ri_K$ can be determined by means of Equation 7. The equation is not entirely accurate because $R_{AEz}$ is not very great as compared with $h_{11}$. Since, with 1 ma. transistor main current, $h_{21}\approx 100$ and $1/h_{22}\approx 100$ kilohms, then, according to Equation 7, $Ri_K\approx 10$ mohms. Thus, the load resistance $R_{AK}$ may, if permitted by $Ri_K$ of the amplifying member Ve1, be about 1 mohm. $h_{11b}$ of the amplifying member Ve1 is 25 ohms at 1 ma. (at 20° C.). If a resistance of 75 ohms would be additionally series-connected in the emitter of the amplifying member Ve1, the voltage amplification, according to Equation 4, would be $10^6/10^2=10^4$.

The present status of the art does not allow to manufacture the current sources Iz, Iz1, Iz2 so uniformly that a small differential amount could not perhaps flow after all through the load resistance. Therefore, in case of the working example shown in FIG. 7, the quiescent direct voltage $U_{AK}$ of the load resistance $R_{AK}$ is controlled by feedback from the collector of the amplifying transistor Ve1 through a Zener diode to the base of the amplifying transistor Ve1. The additional current Iz is fed at the collector of the transistor Ve1. Feedback starts with the resistance $R_T$. It separates the capacitor C from the load resistance $R_{AK}$. $R_T$ and C form a frequency-dependent member. The transistor Vew is connected as a resistance amplifier. Connected in the emitter is the Zener diode Z which, through the resistance $R_Z$, leads to minus and, through the resistance Rv, to the base of the amplifying transistor Ve1. The frequency-dependent member $R_T$, C transmits the direct current to be fed back, i.e. zero frequency, and starts to block at a specific frequency, i.e. the lower limiting frequency because then the reactance of C becomes low as compared with the resistance $R_T$. A direct current is flowing through the resistance $R_T$ to the base of the transistor Vew. The base takes up only a low current corresponding to current amplification between the base and emitter or the resistance amplification. The voltage drop at $R_T$ is low for this reason. The higher current is flowing at the emitter and is determined by the Zener diode Z, the resistances $R_Z$ and Rv and the necessary base current for Ve1. Since the base of Ve1 takes up only a low current and the Zener diode is, therefore, possibly not operated at the Zener slope, the resistance $R_Z$ is intended to increase this Zener current. In the absence of the resistance $R_Z$, only the low base direct current of Ve1 would flow through the Zener diode and Rv. The resistance Rv separates the low-resistance Zener diode and the emitter of Vew from the base of transistor Ve1. If, by any circumstances, the collector quiescent direct current of Ve1 decreases, i.e. $U_{AK}$ becomes more positive, the feedback current through the Zener diode and the base of Ve1 increases. The increased base current of Ve1 readjusts the collector to a more negative value. The control process occurs also in case of inverse drift. Thus, the collector-emitter voltage of the Ve1 equals always the base-emitter voltage of Vew+Zener voltage Uz+base-emitter voltage of Ve1 when neglecting the voltage drops of the resistances $R_T$, R*v* and $R_{AE}$. Thus, the operating point of the V*e*1 is fixed.

Figure 7:
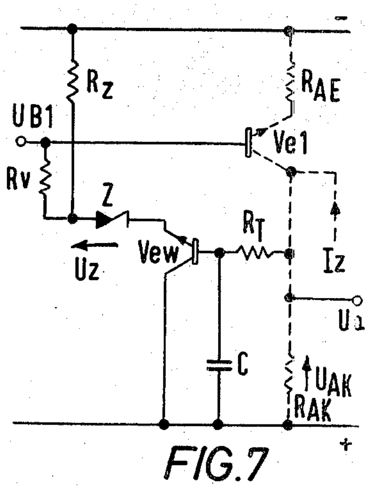
FIG. 7 shows an amplifier stage which is stabilized by feedback to the input of the amplifier transistor and a Zener diode.
Figure 8:
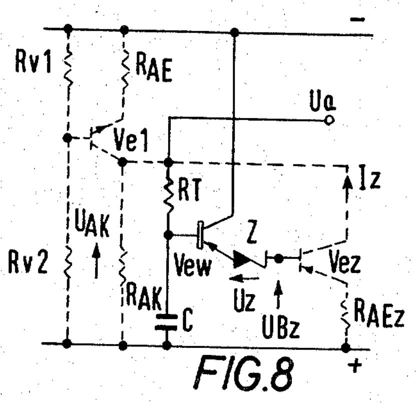
FIG. 8 shows an amplifier stage which is stabilized by feedback to the input of the constant current source and a Zener diode.

FIG. 8 illustrates by way of an example how the quiescent direct voltage $U_{AK}$ is controlled by feedback from the collector of the transistor V*e*1 through a Zener diode to the base of the current-generating V*e*. The reference characters correspond to those of FIG. 7. However, in this case, a fixed quiescent direct voltage is imposed on the base of V*e*1 by means of the resistances R*v*1 and R*v*2 and causes a definite main current to flow through the collector and emitter of the V*e*1. Moreover, the transistor V*ez* generating the additional current, i.e. the pnp transistor, is shown in the diagram with its emitter resistance $R_{AEz}$.

The main current flowing through the transistor V*e*1 and generated by the base bias voltage is to be received substantially by the transistor V*ez*. Only a small amount is intended to flow through the great collector load resistance $R_{AK}$ to make available at the same the quiescent direct voltage desired. By the feedback through the frequency-dependent member $R_T$, C, the resistance amplifier V*ew* a pnp-transistor and the Zener diode Z to the base of the current-generating transistor V*ez*, the quiescent direct voltage $U_{AK}$ of $R_{AK}$ is adjusted to a fixed value. If the main current electrode H*a* of the amplifier member V*e*1 deviates to a more negative value, i.e. if a higher current is flowing through the amplifying member V*e*1, a greater current causing the transistor V*ez* to increase the current flows also into the base of the amplifying member V*ew* and that of the amplifying member V*ez*. Similarly, the control process will also occur in case of inverse drift. The voltage $U_{AK}$ at the load resistance $R_{AK}$ is fixed because it equals always the voltage drop between the base and emitter of the amplifier member V*ew* plus Uz at Z plus $U_{Bz}$, the base voltage of the transistor V*ez* against plus. The voltage drop at $R_T$ may be neglected.

Figure 9:
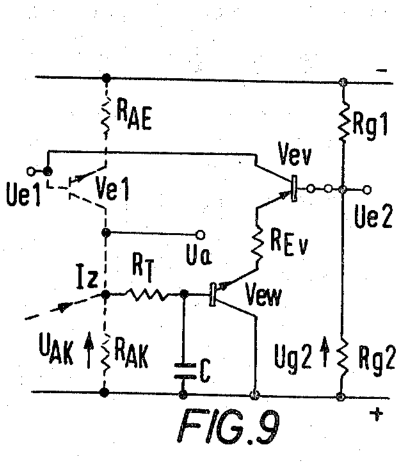
FIG. 9 shows a feedback-connected limiter amplifier.

In case of the working example shown in FIG. 9, the quiescent direct voltage $U_{AK}$ is adjusted retroactively to the input of the amplifying transistor V*e*1 by voltage comparison between a voltage divider (R*g*1, R*g*2) and the collector of the amplifying member V*e*1. The same reference characters as before are used. The emitter base section of the pnp-transistor V*ev* compares the collector voltage of transistor V*e*1 with the voltage divider R*g*1, R*g*2. The emitter of the transistor V*ev* is connected through the resistance R*ev* to the emitter of the resistance-amplifying transistor V*ew*. The collector of the transistor V*ev* furnishes the control current to the base of the amplifying transistor V*e*1. The additional current Iz is fed at the collector of the transistor V*e*1. If the voltage $U_{AK}$ at the collector of transistor V*e*1 becomes more positive, i.e. if less current flows through transistor V*e*1, the voltage between the collector of transistor V*e*1 and the voltage divider increases sufficiently that a higher current flows through the emitter-base section of the transistor V*ev*. This increases the collector current of the transistor V*ev* which flows into the base of the transistor V*e*1 and effects a higher compensating main current in the transistor V*e*1. If the drift migrates to the other side, it is also adjusted. The voltage $U_{AK}$ plus the voltage drop at the base-emitter section of the transistor V*ew* plus the voltage drop of the resistance R*ev* plus the voltage of the emitter-base section of the transistor V*ev* are always equal to the voltage U*g*2 at the voltage divider. The voltage drop at $R_T$ may be neglected. Similarly, the voltage drop at R*ev* is generally very low.

The circuit is suitable for use as limiting amplifier if the input signal voltage U*e*2 is applied to the voltage divider in the feedback loop. In many cases, the signal U*e*2 originates from a collector of a different transistor, the collector quiescent direct voltage of which is equal to the desired reference direct voltage U*g*2 at the voltage divider. This collector may then be connected directly to the base of the transistor V*ev*.

Figure 10:
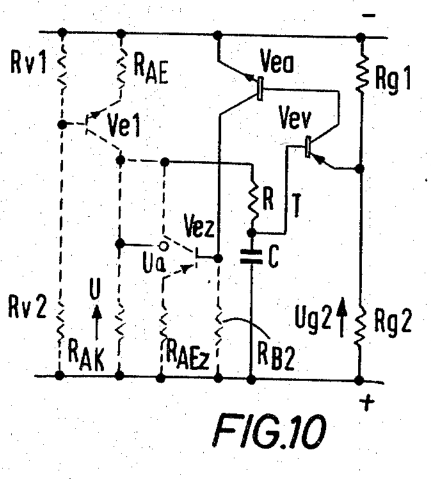
FIG. 10 shows an amplifier with feedback to the input of the constant current source with an additional amplifier element within the feedback branch.

In case of the circuit shown in FIG. 10, the quiescent direct voltage $U_{AK}$ is also adjusted to a fixed value by voltage comparison between the voltage divider R*g*1, R*g*2. However, the feedback control current does not flow into the base of the transistor V*e*1 but into that of the transistor V*ez* producing the additional current. The same reference characters as before are used. As a new member there is shown the transistor V*ea* controlling the transistor V*ez* generating the additional current. The base-emitter section of the transistor V*ev* taps again the voltage $U_{AK}$ of the transistor V*e*1 and the reference voltage of the voltage divider U*g*2. If the voltage drop at the resistance $R_T$ is neglected, then the quiescent direct voltage $U_{AK}$ is always equal to the reference voltage H*g*2 plus the emitter-base voltage of the transistor V*ev*. If the collector of the transistor V*e*1 would become more negative, i.e. if the main current of the transistor V*e*1 increases, then a higher current flows through the base of the transistor V*ev*. This causes an increase in its collector current and, through V*ea*, of the input current from V*ez* which now delivers a higher current to take up the increased current of the transistor V*e*1.

Figure 11:
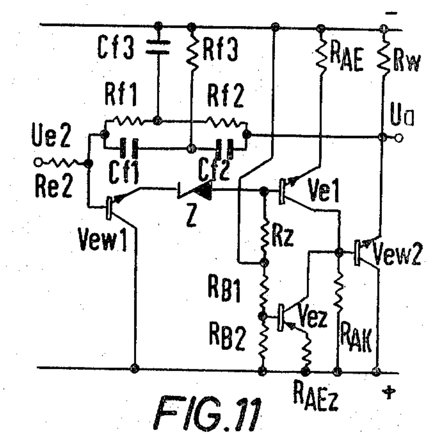
FIG. 11 shows a selective amplifier circuit according to the present invention.

FIG. 11 shows a selective amplifier circuit. V*e*1 is the amplifying transistor on which the additional current from transistor V*ez* is imposed. The emitter resistance of V*e*1 is again designated at $R_{AE}$ and that of transistor V*ez* as $R_{AEz}$. The base voltage of transistor V*ez* is adjusted by the voltage divider $R_{B1}$, $R_{B2}$. Connected to the collector of transistor V*e*1 the load resistance of which is again referred to as $R_{AK}$ is the base of the resistance amplifier V*ew*2 which has the smaller resistance R*w* in its emitter. The feedback loop from the resistance R*w* begins with the member determining the frequency and consisting of the resistances R*f*1, R*f*2, R*f*3 and the capacitors C*f*1, C*f*2, C*f*3 and connected on the other side with the base of the resistance amplifier V*ew*1. Connected in the emitter of the resistance amplifier V*ew*1 is the Zener diode Z determining the operating point and leading to the resistance Rz and the base of the amplifying transistor V*e*1. Feedback is terminated at this point. The input voltage U*e*2 is applied to the feedback loop through the resistance R*e*2. The output voltage $U_A$ is withdrawn at the low-resistance R*w*. The frequency-controlling member R*f*, C*f*, a bridge circuit, blocks only one frequency, i.e. the frequency $f_0$. All other frequencies are returned to the input with a more or less high amount through the feedback loop, i.e. with negative feedback because of the phase rotation by 180° between the base and the collector of the transistor V*e*1. Zero frequency, i.e. the direct voltage, is allowed to pass the frequency-controlling member through R*f*1, R*f*2 for adjustment of the operating point. The quiescent direct voltage is determined by the Zener diode Z as illustrated in FIG. 7. Generation and feeding of the additional current by means of the transistor V*ez* are effected in the same manner as in FIG. 6. Selectivity of the circuit is dependent upon the amplifier characteristics. As is known, the quality is proportional to the voltage amplification. High quality is obtainable with high amplification which, however, must be stable in order that the circuit does not undergo self-excitation. These requirements are met by the circuit in FIG. 11 which readily permits a quality of, for example, 100 to be achieved.

Figure 12:
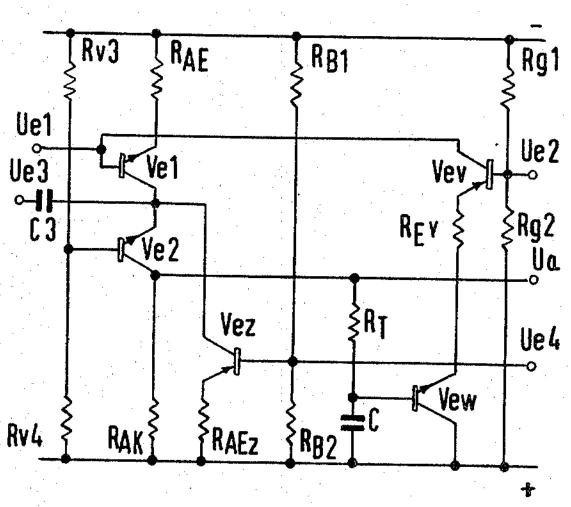
FIG. 12 shows a broadband measuring amplifier.

A further use is illustrated by means of FIG. 12. The circuit is intended to be used as a high-quality broad-band measuring amplifier. The transistors V*e*1 and V*e*2 correspond to those of the circuit in FIG. 4. However, the operating or load resistance $R_{AK}$ is connected in the collector of the second transistor. The additional current is generated by the transistor V*ez* as in FIG. 6. A resistance has not been used for current generation because absolute independence of the current source is to be achieved by the highly resistive collector of transistor V*ez*. Feedback and stabilization of the quiescent direct voltage are effected through the comparing transistor V*ev* as in case of the circuit shown in FIG. 9.

FIG. 12 illustrates especially the various possibilities of feeding. The input signal U*e*1 may be fed to the base of the transistor V*e*1, the signal U*e*2 to the voltage divider or the base of the transistor V*ev*, the signal U*e*3 to the emitter of the transistor V*e*2, and the signal U*e*4 to the base of the current-generating transistor V*ez*. The output signal $U_A$ is withdrawn from the collector of the transistor V*e*2.

A high-quality broad-band amplifier circuit is obtained if $R_{AE}$=37.5 ohms, *Iz*=10 ma. (as in FIG. 4), and $R_{AK}$=40 kilohms, and the input signal U*e*1 is fed to the base of V*e*1 at low resistance as compared with the input resistance. According to Equation (2), $h_{11b1}$ of the transistor V*e*1 (as in FIG. 4) is 2.5 ohms. The overall emitter resistance (internal and external) is then 40 ohms. Variations in temperature by 30° C. are only capable of achieving a total variation in resistance and consequently amplification by 0.625%. Thus, the variation is in the order of magnitude of conventional resistances. With a $R_{AK}$ of 40 kilohms and a supposed quiescent direct voltage on $R_{AK}$ of 8 v., the collector current of the transistor V*e*2 is 50 $\mu$a. The internal resistance of the collector of the transistor V*e*2, $Ri_{K2}$, is about 100 mohms in this case. Thus, it can be entirely neglected as compared with the load resistance of 40 kilohms. According to Equation (4), voltage amplification *Vu*=40,000/40=1000 is obtained. Thus, in the present case, amplification is practically independent of the transistors and the characteristics of the same. The amplifier characteristics are only determined by the resistances $R_{AE}$ and $R_{AK}$. If resistance amplifiers are also inserted before the base of V*e*1, there are obtained input resistances, the limiting values of which are determined by the residual current and which range about 10 mohms. If necessary or desired, field effect transistors may also be used. With these high input resistances, the circuit in FIG. 12 may also serve as electronic amplifier ("vacuum-tube voltmeter").

The input U*e*2 may also serve the amplification of voltage. However, it is particularly suitable for overdriving the amplifier and withdrawing a limited signal at the collector of the transistor V*e*2.

The emitter of the transistor has a very low resistance and may be adjusted at a still lower resistance by means of further additional currents which are also fed at the collector of the transistor V*e*2. If a signal source is to be adapted at low resistance, it is preferably applied to this collector. This input is also suitable as differentiating input with the capacitor C3 representing the differentiating capacitor. The differentiating current flows into the emitter of the transistor V*e*2. These current variations can be withdrawn at the collector as voltage.

The amplification factor can be preferably varied by means of the input U*e*4 since, according to Equation (5), V*u* is proportional to I*e*. However, signal voltages to be amplified are also to be fed to this input.

An input signal U*e*4 modifies the amplification factor of both V*ev* and the transistor Ve1. Therefore, if U*e*2 is applied, $R_{Ev}$=0 and a resistance which is low as compared with the internal resistance is connected to the base of the transistor V*e*1, then the following equations apply to the output signal on $R_{AK}$:

$$U_{AK}=V1\cdot Ue1$$

$$U_{AK}=V1\cdot Vv\cdot Ue2$$

What is claimed is:

1. In a voltage amplifier circuit, in combination:
a transistor having base, collector and emitter electrodes, said transistor being connected in common-emitter configuration;
a passive load resistance directly connected to said collector electrode;
bias means connected across said load resistor and the emitter-collector path of said transistor;
means for applying an input signal to said base electrode for causing an operating direct current to flow in said transistor; and
constant current source means connected in parallel with said load resistance for superimposing an additional direct current upon said transistor in the same direction as said operating direct current, said constant current source means having an internal impedance much greater than that of said load resistance.

2. In the voltage amplifier according to claim 1, wherein said constant current source comprises a second transistor having base, emitter and collector electrodes, the emitter-collector path of said second transistor being connected in parallel with said load resistance and including a stabilizing resistor, the base electrode of said second transistor being connected across said bias means.

3. In the voltage amplifier according to claim 2, wherein a pair of voltage divider resistors connect said base electrode of the second transistor across said bias means, and a capacitor connected in parallel with one of said voltage divider resistors.

4. In the voltage amplifier according to claim 2, including a feedback circuit between the collector electrode of the first transistor and the base electrode thereof, said feedback circuit comprising a third transistor having base, collector and emitter electrodes, a feedback resistor connecting the base electrode of said third transistor to the collector electrode of the first transistor, a capacitor connected to the base electrode of said third transistor and in parallel with said feedback resistor and said load resistance, the collector-emitter path of said third transistor being connected across said bias means and including a Zener diode connected to the emitter electrode of said third transistor and a further resistor in series therewith, and a resistor connected between the base electrode of the first transistor and the junction between said Zener diode and said further resistor.

5. In the voltage amplifier according to claim 2, including a feedback circuit between the collector electrode of the first transistor and the base electrode of said second transistor, said feedback circuit comprising a third transistor having base, emitter and collector electrodes, a feedback resistor and a capacitor in series therewith connected in parallel with said load resistance, the base electrode of said third transistor being connected to the junction between said feedback resistor and said capacitor, and the collector-emitter path of said third transistor being connected across said bias means and including a Zener diode connecting the emitter electrode of said third transistor to the base electrode of the second transistor.

6. In the voltage amplifier according to claim 2, including a feedback circuit between the collector electrode of the first transistor and the base electrode thereof, said feedback circuit including a third transistor having base, emitter and collector electrodes, a feedback resistor and a capacitor in series therewith connected in parallel with said load resistance, the base electrode of said third transistor being connected to the junction between said feedback resistor and said capacitor, a fourth transistor having base, emitter and collector electrodes, a voltage divider chain connected across said bias means and connected to the base electrode of said fourth transistor, the collector electrode of said fourth transistor being connected to the base electrode of the first transistor, a further resistor connecting the emitter electrodes of said third and fourth transistors, and the collector electrode of said third transistor being connected such that the base-collector section of said third transistor is in parallel with said capacitor.

7. The voltage amplifier according to claim 2, including a feedback circuit between the collector electrode of said second transistor and the base electrode thereof, said feedback circuit comprising a feedback resistor and a capacitor in series therewith connected to the collector electrode of said second transistor in parallel with the collector-emitter path thereof, a third transistor having base, collector and emitter electrodes, the base electrode of said third transistor being connected to the junction between said feedback resistor and said capacitor, a voltage divider chain connected across said bias means, the emitter electrode of said third transistor being connected to said voltage divider chain, a fourth transistor having base, emitter and collector electrodes, said fourth transistor having its emitter-collector path connected across said bias means and its collector electrode connected to the base electrode of said second transistor, the collector electrode of said third transistor being connected to the base electrode of said fourth transistor.

8. In the voltage amplifier according to claim 2, including a third transistor having base, collector and emitter electrodes, an output resistor connected to the emitter electrode of said third transistor and the emitter-collector path of said third transistor being connected across said bias means, the base electrode of said third transistor being connected to the collector electrode of the first transistor, and a feedback circuit between the emitter electrode of said third transistor and the base electrode of said first transistor, said feedback circuit comprising a fourth transistor having base, emitter and collector electrodes, a parallel R.C. circuit connecting the emitter electrode of said third transistor with the base electrode of said fourth transistor, a Zener diode connecting the emitter electrode of said fourth transistor with the base electrode of said first transistor, and the base-collector section of said fourth transistor being connected through said R.C. circuit across said bias means.

References Cited

UNITED STATES PATENTS

| | | | |
|---|---|---|---|
| 2,647,958 | 8/1953 | Barney | 330—32 |
| 3,075,151 | 1/1963 | Murray | 330—25X |
| 3,376,516 | 4/1968 | Buots | 330—18X |

FOREIGN PATENTS

| | | |
|---|---|---|
| 974,105 | 11/1964 | Great Britain. |
| 982,129 | 2/1965 | Great Britain. |

OTHER REFERENCES

Butler, "Transistor Wide-Band Cascade Amplifiers," Wireless World, March 1965, pp. 124–128.

ROY LAKE, Primary Examiner

J. B. MULLINS, Assistant Examiner

U.S. Cl. X.R.

330—18, 19, 21, 25, 28, 40